(12) United States Patent
Kim et al.

(10) Patent No.: US 6,912,114 B2
(45) Date of Patent: Jun. 28, 2005

(54) HIGH-CAPACITANCE CAPACITOR HAVING MULTI-LAYERED VERTICAL STRUCTURE

(75) Inventors: Hoon-tae Kim, Yongin (KR); Gea-ok Cho, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 211 days.

(21) Appl. No.: 10/635,472

(22) Filed: Aug. 7, 2003

(65) Prior Publication Data

US 2004/0027785 A1 Feb. 12, 2004

(30) Foreign Application Priority Data

Aug. 12, 2002 (KR) ................................ 10-2002-0047516

(51) Int. Cl.[7] .............................................. H01G 4/228
(52) U.S. Cl. .............................. 361/306.1; 361/306.3; 361/321.1; 361/321.5; 361/311; 361/313
(58) Field of Search .......................... 361/306.1, 306.3, 361/303, 321.1, 321.5, 301.4, 371, 312, 313, 328, 324, 321.4, 302, 305; 257/306, 307, 308

(56) References Cited

U.S. PATENT DOCUMENTS 5,583,359 A * 12/1996 Ng et al. .................... 257/306
6,208,500 B1 * 3/2001 Alexander et al. ........... 361/303
6,266,227 B1 * 7/2001 Konushi et al. .......... 361/306.1
6,297,524 B1 10/2001 Vathulya et al.

OTHER PUBLICATIONS

Alley, "Interdigital . . . ", IEEE Trans. Microwave Theory & Techniques, MTT–18(12):1028–1033 (Dec. 1970).

Esfandiari et al, "Design of . . . ", IEEE Trans. Microwave Theory & Techniques, 31(1):57–64 (Jan. 1983).

* cited by examiner

*Primary Examiner*—Dean A. Reichard
*Assistant Examiner*—Nguyen T. Ha
(74) *Attorney, Agent, or Firm*—Lee & Sterba, P.C.

(57) ABSTRACT

A high-capacitance capacitor having a multi-layered vertical structure for use in an RF circuit is disclosed. The capacitor includes an upper electrode, a lower electrode, and a dielectric layer interposed between the two electrodes. A plurality of electrodes is formed in parallel in the dielectric layer in a diagonal direction. First electrodes, which are half of the plurality of electrodes, are coupled to only the upper electrode, while second electrodes, which are the other half of the plurality of electrodes, are coupled to only the lower electrode. The first electrodes and the second electrodes are alternately positioned in rows and columns. The capacitor does not require additional processes, thereby reducing complexity and cost of fabrication thereof.

5 Claims, 3 Drawing Sheets

(a)    (b)

HIGH-CAPACITANCE CAPACITOR HAVING MULTI-LAYERED VERTICAL STRUCTURE

BACKGROUND OF THE INVENTION

1. Field of the Invention

The present invention relates to a capacitor. More particularly, the present invention relates to a high-capacitance capacitor having a multi-layered vertical structure used in an RF circuit.

2. Description of the Related Art

A process for fabricating a complementary metal oxide semiconductor (CMOS), which was developed to embody digital circuits, is also widely used to fabricate analog circuits. When an RF circuit is fabricated using such a conventional CMOS process, an additional process may be required in order to solve problems caused by high-frequency characteristics of silicon. For example, a process of forming a metal layer should be further added to fabricate a capacitor, which is costly. Also, to form a highly integrated RF circuit, the size of a capacitor should be reduced without reducing the capacitance of the capacitor. However, in a conventional capacitor, the capacitance is reduced along with the size.

SUMMARY OF THE INVENTION

An embodiment of the present invention provides a capacitor having a multi-layered vertical structure and an increased capacitance per unit area that is therefore suitable for use in a highly integrated RF circuit, the capacitor requiring no additional process steps.

In accordance with a feature of an embodiment of the present invention, there is provided a capacitor for use in an RF circuit, including an upper electrode, a lower electrode, and a dielectric layer interposed between the upper electrode and the lower electrode, wherein a plurality of electrodes are formed in parallel in the dielectric layer in a diagonal direction, first electrodes, which are half of the plurality of electrodes, are coupled to only the upper electrode, and second electrodes, which are the other half of the plurality of electrodes, are coupled to only the lower electrode, and the first electrodes and the second electrodes are alternately arranged in rows and columns.

Preferably, at least one of the first electrodes and at least one of the second electrodes are positioned in a staircase form and include a plurality of conductive plugs and a plurality of metal layers for coupling the conductive plugs in parallel, wherein the conductive plugs are horizontally spaced apart from each other by an interval that is smaller than the horizontal length of the metal layers and vertically spaced apart from each other by an interval equal to the thickness of the metal layers.

Preferably, at least one of the first electrodes and at least one of the second electrodes include two conductive plugs horizontally spaced apart from each other by an interval that is smaller than a length of the metal layers, and vertically spaced apart from each other by an interval equal to a thickness of the metal layers, and one metal layer, which couples a lower end of one of the two conductive plugs to an upper end of the other conductive plug.

The dielectric layer is preferably a silicon nitride ($Si_3N_4$) layer; however, the dielectric layer may be a material layer having a higher or lower dielectric constant than the silicon nitride ($Si_3N_4$) layer.

The capacitor of an embodiment of the present invention is fabricated using a CMOS process and does not require any additional processes. Thus, the fabrication process for the capacitor of the present invention may be simplified, and the fabrication costs reduced, as compared with those of the conventional method. Further, in the capacitor of the present invention, the capacitance per unit area may be increased over that of a conventional capacitor.

BRIEF DESCRIPTION OF THE DRAWINGS

The above and other features and advantages of the present invention will become more apparent by describing in detail preferred embodiments thereof with reference to the attached drawings in which.

DETAILED DESCRIPTION OF THE INVENTION

Figure 1:
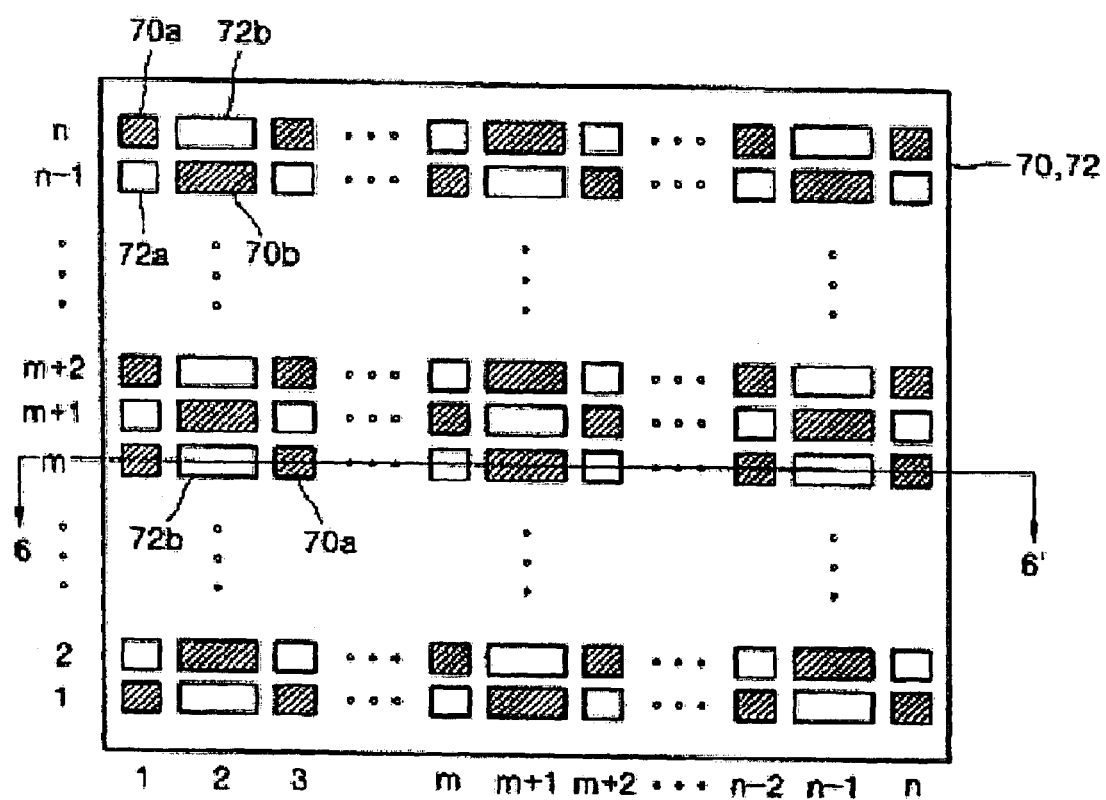
FIG. 1 illustrates a plan view of a high-capacitance capacitor having a multi-layered vertical structure according to an embodiment of the present invention.

Korean Patent Application No. 2002-47516, filed on Aug. 12, 2002, and entitled: "High-Capacitance Capacitor Having Multi-Layered Vertical Structure," is incorporated by reference herein in its entirety.

A capacitor having a multi-layered vertical structure (hereinafter, referred to as a "multi-layered vertical capacitor") according to an embodiment of the present invention will be described in detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like numbers refer to like elements throughout.

FIG. 1 illustrates a plan view of a multi-layered vertical capacitor of the present invention. In FIG. 1, reference numeral 70 denotes an upper electrode, and reference numeral 72 denotes a lower electrode that faces the upper electrode 70 and is positioned under the upper electrode 70. Reference numerals 70a and 70b denote first electrodes which are coupled to a side of the upper electrode 70 facing the lower electrode 72, and reference numerals 72a and 72b denote second electrodes which are coupled to a side of the lower electrode 72 facing the upper electrode 70. The first electrodes 70a and 70b extend toward the lower electrode 72, but do not contact the lower electrode 72, and the second electrodes 72a and 72b extend toward the upper electrode 70, but do not contact the upper electrode 70. The first electrodes 70a and 70b and the second electrodes 72a and 72b are not visible from above unless the upper electrode 70 is transparent. However, the first electrodes 70a and 70b and the second electrodes 72a and 72b are illustrated in FIG. 1 to facilitate understanding.

In the drawing of FIG. 1, to distinguish the first electrodes 70a and 70b contacting only the upper electrode 70 from the second electrodes 72a and 72b contacting only the lower electrode 72, the first electrodes 70a and 70b are striped. Also, in FIG. 1, 1, 2, 3, . . . , m, m+1, n−1, n, shown on the horizontal axis, represent column positions of the first electrodes 70a and 70b or the second electrodes 72a and 72b, and 1, 2, 3, . . . m, m+1, . . . , n−1, n, shown on the vertical axis, represent row positions of the first electrodes 70a and 70b or the second electrodes 72a and 72b. Hereinafter, (m, m+1) denotes an electrode positioned in an $m^{th}$ column and in an $m+1^{th}$ row.

Referring to FIG. 1, an area of the first electrode 70a is different from that of the first electrode 70b. In other words, the contact area between the upper electrode 70 and the first electrode 70a is different from the contact area between the upper electrode 70 and the first electrode 70b. In the second electrodes 72a and 72b, an area of an end of the second electrode 72a facing the upper electrode 70 is different from the area of an end of the second electrode 72b facing the upper electrode 70, as described in detail later. The first electrodes 70a and 70b and the second electrodes 72a and 72b are arranged to alternate in both columns and rows of a matrix. Also, the first electrodes 70a and 70b are coupled to the upper electrode 70, and the second electrodes 72a and 72b are coupled to the lower electrode 72.

Figure 2:
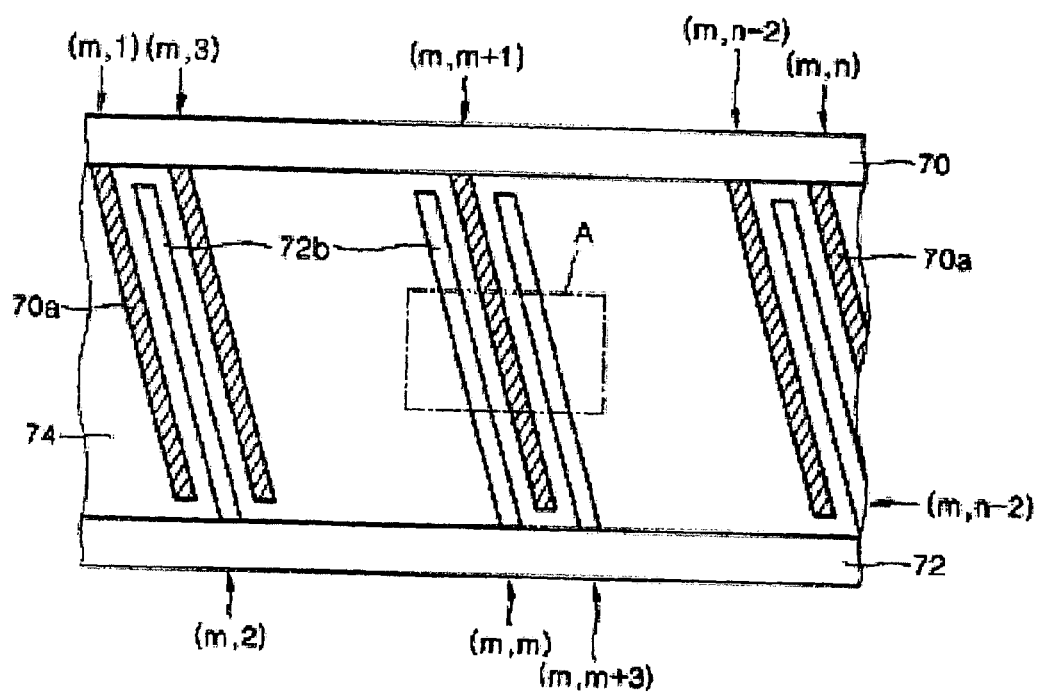
FIG. 2 illustrates a cross-sectional view taken along line 6–6' of FIG. 1.

Referring to FIG. 2 taken along line 6–6' of FIG. 1, a dielectric layer 74 is formed between the upper electrode 70 and the lower electrode 72, and a plurality of first electrodes 70a and 70b and a plurality of second electrodes 72a and 72b are formed in parallel in the dielectric layer 74 in a diagonal direction. Here, inclinations of the first electrodes 70a and 70b and the second electrodes 72a and 72b are adjusted in fabrication processes thereof according to design specifications. As described above, the plurality of first electrodes 70a and 70b are coupled to only the upper electrode 70, while the plurality of second electrodes 72a and 72b are coupled to only the lower electrode 72.

As shown in FIG. 2, the first electrodes 70a and 70b and the second electrodes 72a and 72b are alternately formed in rows from left to right. The first electrodes 70a and 70b and the second electrodes 72a and 72b are also alternately formed in the columns, as is apparent from the plan view of FIG. 1. Thus, each of the second electrodes 72a and 72b is necessarily positioned between the first electrodes 70a and 70b on the left and right and to the front and back thereof, and each of the first electrodes 70a and 70b is necessarily positioned between the second electrodes 72a and 72b.

While the first electrodes 70a and 70b and the second electrodes 72a and 72b are positioned diagonally in parallel so that the first electrodes 70a and 70b and the second electrodes 72a and 72b alternate in rows and columns, different polarities are applied to the respective electrodes. Thus, the electrodes of one group, e.g., the first electrodes 70a and 70b, are coupled with the adjacent electrodes of the other group, e.g., the second electrodes 72a and 72b. Further, because all of the electrodes 70a, 70b, 72a, and 72b are oriented diagonally, the areas of the electrodes 70a, 70b, 72a, and 72b facing each other are larger than in the conventional capacitor in which the electrodes are arranged at right angles to the upper and lower electrodes. As a result, the capacitance of a capacitor according to the present invention is larger than that of a conventional capacitor.

The dielectric layer 74 formed between the upper electrode 70 and the lower electrode 72 is preferably a silicon nitride ($Si_3N_4$) layer. However, it is possible to use any other silicon nitride layer having different proportions of Si and N, a material layer (e.g., a silicon oxide layer) having a lower dielectric constant than that of the $Si_3N_4$ layer, or a material layer having a higher dielectric constant than that of the $Si_3N_4$ layer, such as a $Ta_2O_5$ layer, an STO layer, or a PZT layer.

Figure 3:
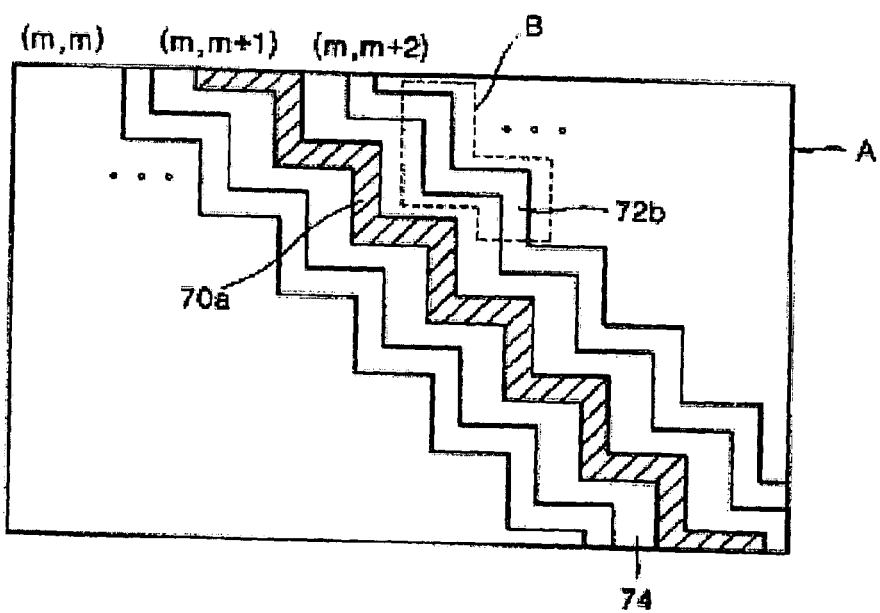
FIG. 3 illustrates an enlarged cross-sectional view of a region A of FIG. 2.

Meanwhile, the first electrodes 70a and 70b and the second electrodes 72a and 72b may have various shapes, while being positioned diagonally in parallel. FIG. 3 shows such an exemplary arrangement of the electrodes 70a, 70b, 72a, and 72b.

Specifically, FIG. 3 illustrates an enlarged view of a region A of FIG. 2, in which the first electrodes 70a and 70b and the second electrodes 72a and 72b are formed in a staircase form. Because the first electrodes 70a and 70b and the second electrodes 72a and 72b are positioned in a diagonal direction, upper ends of the first electrodes 70a and 70b correspond to horizontal portions of staircases, while upper ends of the second electrodes 72a and 72b correspond to vertical portions of staircases. For this reason, sectional areas of the upper ends of the electrodes 70a, 70b, 72a, and 72b are each different. This case may be applied to the connections of the first electrodes 70a and 70b and the upper electrode 70, and connections of the second electrodes 72a and 72b and the lower electrode 72. As a result, as shown in FIG. 1, areas of the first electrodes 70a and 70b contacting the upper electrode 70 differ, and sectional areas of the second electrodes 72a and 72b extending toward the upper electrode 70 differ.

Figure 4:
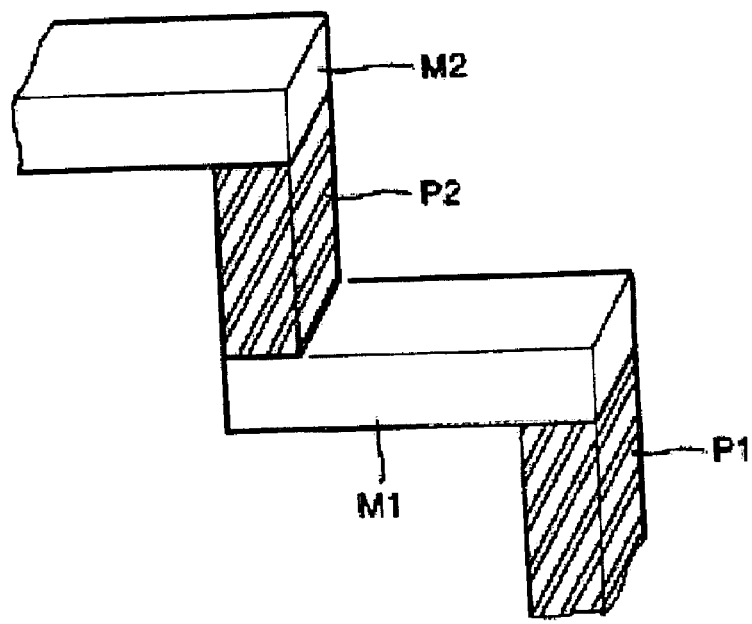
FIG. 4 illustrates an enlarged perspective view of a region B of FIG. 3.

FIG. 4 illustrates an enlarged perspective view of a region B of the second electrode 72b of FIG. 3. The following description applies equally to the first electrodes 70a and 70b.

Referring to FIG. 4, each of the first electrodes 70a and 70b or the second electrodes 72a and 72b comprises a plurality of conductive plugs P1 and P2, which are vertical components of "staircases," and a plurality of metal layers M1 and M2, which are horizontal components of the "staircases." The conductive plugs P1 and P2 are vertically spaced apart from each other by an interval that is equal to the thickness of the metal layer M1 and horizontally spaced apart from each other by an interval that is smaller than the length of the metal layer M1. Each of the metal layers M1 and M2 connects an upper end of one of two conductive plugs and a lower end of the other conductive plug.

Hereinafter, results of a comparison of the multi-layered vertical capacitor according to the present invention and the conventional capacitor in which the first and second electrodes are formed at right angles with respect to the upper and lower electrodes will be described in detail.

Figure 5:
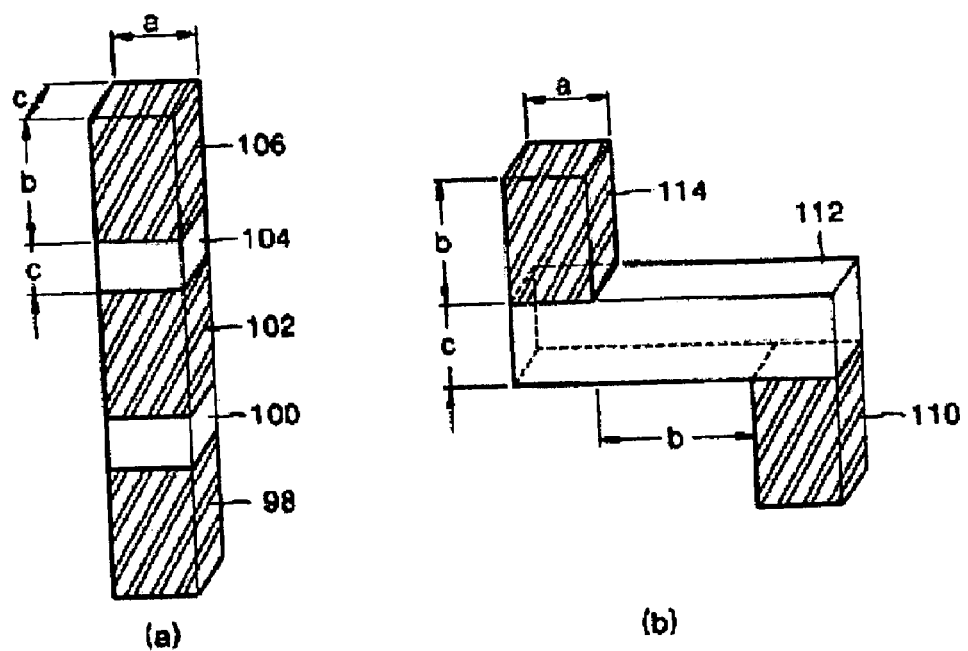
FIG. 5 illustrates a perspective view showing segments of elements, which are used to compare characteristics of a conventional capacitor and a capacitor according to an embodiment of the present invention.

FIG. 5 illustrates a perspective view for comparing the multi-layered vertical capacitor of the present invention with a conventional capacitor. In FIG. 5, (a) is a partial perspective view of an electrode (hereinafter, referred to as a "vertical electrode") which is perpendicular to a lower electrode or an upper electrode of a conventional capacitor, and (b) is a partial perspective view of the first electrode or the second electrode of the multi-layered vertical capacitor of the present invention.

In (a), reference numerals 98, 102, and 106 denote first through third conductive plugs, respectively, and reference numerals 100 and 104 denote first and second metal layers, respectively. Here, the section of each conductive plug is a square with sides of length a. Also, the height of each conductive plug 98, 102, and 106 is taken to be b, and the thickness of the first metal layer 100 and the second metal layer 104 is taken to be c.

For practical use, the first metal layer 100 and the second metal layer 104, which are coupled to the respective conductive plugs 98, 102, and 106, preferably have larger areas than the respective conductive plugs by 0.1 $\mu$m or more. However, in this embodiment, it is supposed that the metal layers 100 and 104 have the same areas as the conductive plugs 98, 102, and 106.

In (b), reference numerals 110 and 114 denote fourth and fifth conductive plugs, respectively, and reference numeral 112 denotes a fourth metal layer which connects an upper end of the fourth conductive plug 110 with a lower end of the fifth conductive plug 114. The thickness of the fourth metal layer 112 is presumed to be the same as that of the first metal layer 100 or the second metal layer 104. Also, it is supposed that heights of the fourth and fifth conductive plugs 110 and 114 have the same value b as a horizontal interval between the fourth and fifth conductive plugs 110 and 114.

In the following Tables 1 through 3, reference characters A1, V1, and A1/N1 denote the volume, the coupling area, and the coupling area per unit volume of the conventional vertical electrode, while reference characters A2, V2, and A2/N2 denote the volume, the coupling area, and the coupling area per unit volume of the electrode of the multi-layered vertical capacitor according to the present invention.

Table 1 shows a variation in capacitance of a capacitor with respect to the thickness of metal layers 100, 104, and 112. Table 2 shows a variation in the capacitance of the capacitor with respect to the sectional area of the conductive plugs 98, 102, 106, 110 and 114, and Table 3 shows a variation in the capacitance of the capacitor with respect to both the thickness of the metal layers 100, 104, and 112 and the sectional area of the conductive plugs 98, 102, 106, 110 and 114.

Referring to Table 1, in which the thickness of the metal layers 100, 104, and 112 varies while the height b of the conductive plugs 98, 102, 106, 110 and 114 remains fixed, values are determined for a and c that enable the conventional capacitor and the multi-layered vertical capacitor of the present invention to have the same performance. Then, in a state where the previously determined sectional area a of the conductive plugs 98, 102, 106, 110 and 114 is fixed, the thickness c of the first through third metal layers 100, 104, and 112 is varied from 6 $\mu$m to 2 $\mu$m.

TABLE 1

| a<br>[$10^{-6}$ m] | b<br>[$10^{-6}$ m] | c<br>[$10^{-6}$ m] | A1<br>[$10^{-12}$ m$^2$] | V1<br>[$10^{-18}$ m$^3$] | A1/V1<br>[$10^{-6}$ m] | A2<br>[$10^{-12}$ m$^2$] | V2<br>[$10^{-12}$ m$^2$] | A2/V2<br>[$10^{-6}$ m] | (A2/V2)/(A1/V1)<br>[%] |
|---|---|---|---|---|---|---|---|---|---|
| 0.6 | 0.9 | 0.6 | 9.36 | 1.40 | 6.67 | 9.36 | 1.40 | 6.67 | 100.0 |
| 0.6 | 0.9 | 0.5 | 8.88 | 1.33 | 6.67 | 8.82 | 1.28 | 6.90 | 103.5 |
| 0.6 | 0.9 | 0.4 | 8.40 | 1.26 | 6.67 | 8.28 | 1.15 | 7.19 | 107.8 |
| 0.6 | 0.9 | 0.3 | 7.92 | 1.19 | 6.67 | 7.74 | 1.03 | 7.54 | 113.2 |
| 0.6 | 0.9 | 0.2 | 7.44 | 1.12 | 6.67 | 7.20 | 0.90 | 8.00 | 120.0 |

As shown in Table 1, when the volume is the same, the capacitance of the multi-layered vertical capacitor according to the present invention is larger by 20% than the capacitance of the conventional capacitor.

Meanwhile, in a case where the first through third metal layers 100, 104, and 112 are formed of aluminium, the thickness thereof ranges from 4 $\mu$m to 6 $\mu$m, and in a case where the first through third metal layers 100, 104, and 112 are formed of copper, the thickness thereof ranges from 4 $\mu$m to 2 $\mu$m. No additional process is required to reduce the thickness of the metal layers, and the resistance of the metal layers may be maintained at a constant level by forming the metal layers to be thin.

However, in the multi-layered vertical capacitor of the present invention, because current flows not in a horizontal direction but in a vertical direction, the capacitance of the capacitor is determined by the sectional area a of the conductive plug rather than the thickness c of the metal layers, which is shown in the following Table 2.

TABLE 2

| a<br>[$10^{-6}$ m] | b<br>[$10^{-6}$ m] | c<br>[$10^{-6}$ m] | A1<br>[$10^{-12}$ m$^2$] | V1<br>[$10^{-18}$ m$^3$] | A1/V1<br>[$10^{-6}$ m] | A2<br>[$10^{-12}$ m$^2$] | V2<br>[$10^{-12}$ m$^2$] | A2/V2<br>[$10^{-6}$ m] | (A2/V2)/(A1/V1)<br>[%] |
|---|---|---|---|---|---|---|---|---|---|
| 0.6 | 0.9 | 0.6 | 9.36 | 1.40 | 6.67 | 9.36 | 1.40 | 6.67 | 100.0 |
| 0.7 | 0.9 | 0.6 | 10.92 | 1.91 | 5.71 | 10.88 | 1.85 | 5.89 | 103.0 |
| 0.8 | 0.9 | 0.6 | 12.48 | 2.50 | 5.00 | 12.44 | 2.35 | 5.29 | 105.8 |
| 0.9 | 0.9 | 0.6 | 14.04 | 3.16 | 4.44 | 14.04 | 2.92 | 4.81 | 108.3 |
| 1.0 | 0.9 | 0.6 | 15.60 | 3.90 | 4.00 | 15.68 | 3.54 | 4.43 | 110.7 |

Referring to Table 2, when resistance is reduced by increasing the length a of one side of the section of the conductive plug from 0.6 $\mu$m to 1.0 $\mu$m, the capacitance of the multi-layered vertical capacitor of the present invention increases to 10% more than that of the conventional capacitor.

Meanwhile, referring to Table 3, when both the sectional areas of the first through fifth conductive plugs 98, 102, 106, 110, and 114 and the thicknesses c of the first through third metal layers 100, 104, and 112 are varied, the capacitance of the multi-layered vertical capacitor of the present invention increases to 32% more than that of the conventional capacitor.

TABLE 3

| a [$10^{-6}$ m] | b [$10^{-6}$ m] | c [$10^{-6}$ m] | A1 [$10^{-12}$ m$^2$] | V1 [$10^{-18}$ m$^3$] | A1/V1 [$10^{-6}$ m] | A2 [$10^{-12}$ m$^2$] | V2 [$10^{-12}$ m$^2$] | A2/V2 [$10^{-6}$ m] | (A2/V2)/(A1/V1) [%] |
|---|---|---|---|---|---|---|---|---|---|
| 0.6 | 0.9 | 0.6 | 9.36 | 1.40 | 6.67 | 9.36 | 1.40 | 6.67 | 100.0 |
| 1.0 | 0.9 | 0.2 | 12.40 | 3.10 | 4.00 | 12.56 | 2.38 | 5.28 | 131.9 |

As described above, the multi-layered vertical capacitor of the present invention requires no additional processes, thus simplifying the fabrication process and reducing the fabrication costs over those of the conventional capacitor. Also, a plurality of first electrodes, which are coupled to only an upper electrode, and a plurality of second electrodes, which are coupled to only a lower electrode and formed between the first electrodes, are positioned in a dielectric layer in a staircase form in a diagonal direction. As a result, the coupling area per unit volume of the multi-layered vertical capacitor of the present invention is larger than that of the conventional capacitor, thus increasing the capacitance of the capacitor.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, at least one of a plurality of metal layers may be formed by one of ordinary skill in the art to be longer than the rest. Also, at least one of a plurality of conductive plugs may be formed to be longer than the rest. Further, part of the conductive plugs or part of the metal layers may be formed of different materials.

What is claimed is:

1. A capacitor used in an RF circuit, comprising an upper electrode, a lower electrode, and a dielectric layer interposed between the upper electrode and the lower electrode,
   wherein each electrode of a plurality of electrodes is formed in parallel in the dielectric layer in a diagonal direction between the upper electrode and the lower electrode,
   wherein first electrodes, which are half of the plurality of electrodes, are coupled to only the upper electrode, and second electrodes, which are the other half of the plurality of electrodes, are coupled to only the lower electrode, and the first electrodes and the second electrodes are alternately positioned in rows and columns.

2. The capacitor as claimed in claim 1, wherein the dielectric layer is a $Si_3N_4$ layer.

3. A used in an RF circuit, comprising an upper electrode, a lower electrode, and a dielectric layer interposed between the upper electrode and the lower electrode,
   wherein a plurality of electrodes are formed in parallel in the dielectric layer in a diagonal direction, first electrodes, which are half of the plurality of electrodes, are coupled to only the upper electrode, and second electrodes, which are the other half of the plurality of electrodes, are coupled to only the lower electrode, and the first electrodes and the second electrodes are alternately positioned in rows and columns,
   wherein at least one of the first electrodes and at least one of the second electrodes are positioned in a staircase form and comprise a plurality of conductive plugs and a plurality of metal layers for coupling the conductive plugs in parallel,
   wherein the conductive plugs are horizontally spaced apart from each other by an interval that is smaller than the horizontal length of the metal layers and vertically spaced apart from each other by an interval that is equal to the thickness of the metal layers.

4. The capacitor as claimed in claim 3, wherein at least one of the first electrodes and at least one of the second electrodes comprise:
   two conductive plugs, which are horizontally spaced apart from each other by an interval that is smaller than the length of the metal layers and vertically spaced apart from each other by an interval that is equal to the thickness of the metal layers, and
   one metal layer, which couples a lower end of one of the two conductive plugs to an upper end of the other conductive plug.

5. The capacitor as claimed in claim 3, wherein the dielectric layer is a $Si_3N_4$ layer.

* * * * *